United States Patent
Kudelka et al.

(10) Patent No.: US 7,666,752 B2
(45) Date of Patent: Feb. 23, 2010

(54) DEPOSITION METHOD FOR A TRANSITION-METAL-CONTAINING DIELECTRIC

(75) Inventors: Stephan Kudelka, Dresden (DE); Lars Oberbeck, Dresden (DE); Uwe Schroeder, Dresden (DE); Tim Boescke, Hamburg (DE); Johannes Heitmann, Dresden (DE); Annette Saenger, Dresden (DE); Joerg Schumann, Dresden (DE); Elke Erben, Dresden (DE)

(73) Assignee: Qimonda AG, Munich (DE)

( * ) Notice: Subject to any disclaimer, the term of this patent is extended or adjusted under 35 U.S.C. 154(b) by 20 days.

(21) Appl. No.: 11/655,583

(22) Filed: Jan. 19, 2007

(65) Prior Publication Data

US 2008/0173919 A1 Jul. 24, 2008

(51) Int. Cl.
*H01L 21/20* (2006.01)

(52) U.S. Cl. ............... 438/381; 438/239; 438/250; 438/393; 438/387; 438/396; 427/255.31; 427/255.36; 427/255.7; 427/255.6; 427/255.395; 427/419.2; 257/68; 257/71; 257/298; 257/532; 257/E29.342; 257/E27.048; 257/E21.396; 257/E21.008; 257/E21.647; 257/310; 257/306

(58) Field of Classification Search ............... None
See application file for complete search history.

(56) References Cited

U.S. PATENT DOCUMENTS

| 7,382,014 | B2 * | 6/2008 | Iijima ................... 257/310 |
| 2005/0070063 | A1 * | 3/2005 | Im et al. ............... 438/240 |
| 2005/0255246 | A1 * | 11/2005 | Kim et al. ........... 427/255.28 |
| 2006/0205143 | A1 | 9/2006 | Govindarajan |
| 2007/0048953 | A1 * | 3/2007 | Gealy et al. ........... 438/305 |

FOREIGN PATENT DOCUMENTS

| DE | 10 2006 00613 | 8/2006 |
| WO | WO 2004/042804 | 5/2004 |

OTHER PUBLICATIONS

German Examination Report dated Oct. 31, 2007.

\* cited by examiner

*Primary Examiner*—Minh-Loan T Tran
*Assistant Examiner*—Fei Fei Yeung Lopez
(74) *Attorney, Agent, or Firm*—Fay Kaplun & Marcin, LLP

(57) ABSTRACT

The present invention relates to a method for depositing a dielectric material comprising a transition metal compound. After providing a substrate, a first pre-cursor comprising a transition metal compound and a second pre-cursor predominantly comprising at least one of water vapour, ammonia and hydrazine are successively applied on the substrate for forming a first layer of transition metal containing material. In a next step the first pre-cursor and a third pre-cursor comprising at least one of ozone and oxygen are successively applied on the first layer for forming a second layer of the transition metal containing material.

9 Claims, 3 Drawing Sheets

DEPOSITION METHOD FOR A TRANSITION-METAL-CONTAINING DIELECTRIC

BACKGROUND OF THE INVENTION

1. Field of the Invention

The present invention relates to a deposition method for a transition-metal-containing dielectric.

2. Description of the Related Art

Although in principle applicable to arbitrary integrated semiconductor structures, the following invention and the underlying problems will be explained with respect to integrated DRAM memory circuits in silicon technology.

Memory cells of a DRAM device each comprise a capacitor for storing information encoded as electric charge retained in the capacitor. A reliable operation of the memory cells demands for a minimal capacitance of the capacitors and a sufficiently long retention time of the charge in the capacitors.

There is a major interest to further reduce the lateral dimensions of structures of a DRAM, at present 45 nm are envisaged. Therefore, it becomes necessary to compensate the shrinking lateral dimensions of the capacitors by increasing the k-value of the dielectric layer. The use of high k-dielectric layers demands for development of new deposition techniques, which can be combined with standard processing steps like high-temperature annealing steps. In particular a heat assisted migration of oxides formed on metallic electrodes into the dielectric layers must be inhibited as these oxides tend to reduce the band gap of the dielectric materials and to increase leakage currents, which cause a short retention time.

BRIEF SUMMARY OF THE INVENTION

According to a first aspect of the invention, a deposition method for a transition metal containing dielectric comprises:
  providing a substrate with at least one conductive portion;
  successively applying a first pre-cursor comprising a transition metal compound and a second pre-cursor predominantly comprising at least one of water vapour, ammonia and hydrazine on the substrate for forming a first layer of a transition metal containing material, and
  successively applying the first pre-cursor and a third pre-cursor comprising at least one of ozone and oxygen on the first layer for forming a second layer of the transition metal containing material.

A method according to the invention uses two sets of pre-cursors to deposit the transition metal containing material. The first pre-cursor pair uses water vapour, ammonia or hydrazine as a weak reactant for the first pre-cursor. The weak reactants are oxidants in the language of chemistry, i.e. they gain electrons in the chemical redox reactions with the first pre-cursor of the respective pair. The weak reactants sufficiently react with first pre-cursor to set free the transition metal, which is then deposited onto the conductive portion of the substrate. The weak reactants, however, tend not to react with the substrate. In particular, water vapour does not react with metallic substrates. Hence, only a neglectable fraction of oxide of the substrate is generated. Preferably, after the substrate is covered by the first layer, a second pair of pre-cursors for the atomic layer deposition method is used. The weak reactants are substituted by strong reactants. As preferred species, ozone is more reactive than the above weak reactants. The ozone and oxygen not only sets free the transition metal of the first pre-cursor, but transforms the organic parts of the first pre-cursor into highly volatile gases, in particular the carbon content. The advantage of ozone over water is its higher cleaning effect, that is to say less residuals of the organic compounds of the first precursors remain in the first and the second layer.

The use of water vapour and ozone is preferred.

In case ammonia or hydrazine is used as weak reactant, a transition metal nitride layer is formed. The later use of the strong reactant comprising oxygen transforms the thin transition metal nitride layer into the desired a transition metal oxide layer.

One advantage of the above method is to provide a clean transition metal containing material layer, in particular a transition metal oxide containing layer, on a substrate and to inhibit the formation of a substrate oxide. Therefore, a later annealing step can be applied to the semiconductor device using the inventive method as an intermediate step, without a migration of oxides from the substrate into the first and second layer of the transition metal containing material.

The transition metal can be chosen of at least one of hafnium and zirconium.

The first layer may be formed with a thickness of 1-8 nanometres. The transition metal content of the first layer exceeds 50 atomic percent of all metallic atoms in the first layer. Silicon is considered as metal.

A dopant can be applied along with the first pre-cursor, the dopant comprising a metal, the metal being at least one of the group of silicon, aluminium, rare earth metal, titan, hafnium, tantalum, barium, scandium, yttrium, lanthanum, niobium, bismuth, calcium and cerium. The dopants can be provided by a fourth pre-cursor, which is inserted into a reaction chamber along with the first pre-cursor. The dopants can be used to increase the crystallization temperature of a transition metal oxide, in particular of zirconium oxide and hafnium oxide. It has been demonstrated that the dielectric properties dielectric layers of transition metal oxides are superior, when deposited as amorphous or nanocrystalline material. The increase of the crystallization temperature or the dopants easies the deposition of amorphous transition metal oxides and stabilizes the amorphous state against crystallization during the deposition. After the dielectric layer is deposited a controlled crystallization step is performed. Hence, a specific crystal type of the dielectric layer can be achieved.

The conductive portion of the substrate can be formed of at least one material of the preferred group of titanium, titanium compounds and titanium nitride and of the preferred group of carbon, tantalum nitride, tungsten, ruthenium and platinum. In particular, titanium nitride (TiN) is of interest as bottom and/or top electrodes for metal insulator metal (MIM) capacitors.

First pre-cursors can comprise at least one compound of the group of tetrakis (dialkyl amido) hafnium, tetrakis (diethyl amido) hafnium (TDEAH), tetrakis (dimethyl amido) hafnium (TDMAH), tetrakis (ethyl methyl amido) hafnium (TEMAH), mono-cyclopentadienyl hafnium, bis-cyclopentadienyl hafnium, tetrakis (dialkyl amido) zirconium, tetrakis (diethyl amido) zirconium, tetrakis (dimethyl amido) zirconium, tetrakis (ethyl methyl amido) zirconium, mono-cyclopentadienyl zirconium, and bis-cyclopentadienyl zirconium.

A third layer can be formed on the second layer by only applying a dopant. This layer is preferably only a few nanometres thick. It advantageously stabilizes the amorphous or nanocrystalline state of the transition metal oxide form in the first and second layers.

A fourth layer may be deposited on the third layer by successively applying the first pre-cursor and water vapour. Subsequently, a fifth layer can be deposited on the fourth layer by applying the first pre-cursor and ozone.

After the deposition of the first and the second layers a high temperature annealing step may be applied.

According to an other aspect of the invention the following steps are performed:

provide a substrate with at least conductive portions at the surface;

successively applying a first pre-cursor comprising a transition metal compound and a second pre-cursor predominantly comprising at least one of ozone, ammonia and hydrazine on the conductive portion for forming a lower layer of a transition metal containing material;

depositing an intermediate layer consisting of at least one of the group silicon, aluminium, rare earth metal, titanium, hafnium, tantalum, barium, scandium, yttrium, lanthanum, niobium, bismuth, calcium and cerium; and successively applying the first pre-cursor and the second pre-cursor for forming an upper layer of a transition metal containing material.

A capacitor structure manufactured by the inventive method comprises:

a first electrode made of a metal;

a first dielectric layer in contact to the first electrode, the dielectric layer comprising an oxide of a transition metal;

a second dielectric layer in contact to the first dielectric layer, the second dielectric layer having a reduced amount of carbon containing compounds compared to the first dielectric layer; and a counter electrode arranged on the second dielectric layer.

A further capacitor structure comprises:

a first electrode made of at least one of titan, titanium compounds, titanium nitride, carbon, tantalum nitride, tungsten, ruthenium and platinum;

at least two dielectric layers comprising at least one of hafnium oxide or zirconium oxide and doped with a dopant material;

a layer predominantly made of the dopant material separating at least two of the at least two dielectric layers; and a counter electrode arranged on the second dielectric layer.

The metal may be at least one of the group of titan, titanium compounds, titanium nitride, carbon, tantalum nitride, tungsten, ruthenium and platinum. Titan nitride electrodes are preferred. The oxide free interface or surface of the first electrode is ensured by the formation with the invention deposition method of the dielectric layers. The slightly higher content of carbon compounds in the first layer compared to the second layer is due to the use of the weaker reactant for the first layer. The concentration gradient of the carbon compound content and the basically metal oxide free first electrode makes the capacitor distinct to capacitors formed by a single step deposition of the dielectric layer.

A semiconductor memory device may comprise a plurality of memory cells each comprising the inventive capacitor.

DESCRIPTION OF THE DRAWINGS

In the Figures.

In the Figures, like numerals refer to the same or similar functionality throughout the several views.

DETAILED DESCRIPTION OF THE INVENTION

Figure 1:
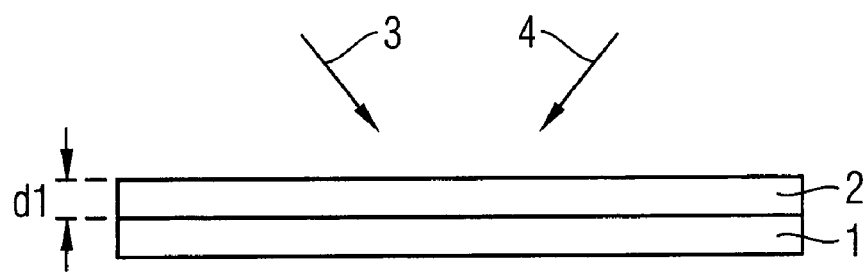
FIGS. 1 and 2 show schematic cross sections of a deposition method according to a first embodiment of the invention.
Figure 2:
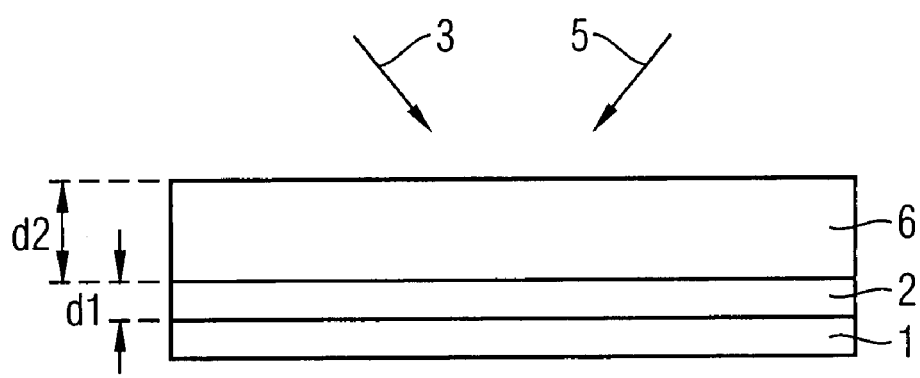

A first embodiment is illustrated along with the FIG. 1 and FIG. 2. Preferably a structured conductive layer is provided, later on called substrate 1, which may form a bottom electrode of a capacitor. The structured substrate 1 preferably comprises a titanium nitride based structure or of other species of the group of carbon, tantalum nitride, tungsten, ruthenium and/or platinum.

In a first step of the first embodiment a dielectric layer 2 comprising zirconium oxide (ZrO) is deposited by an atomic layer deposition (ALD) method. The below description only mentions zirconium, but is not restricted to the use of zirconium. Hafnium can be used instead of or additional to zirconium, for instance.

A first pre-cursor 3 and a second pre-cursor 4 are introduced alternatingly into a reaction chamber, in which the substrate 1 is placed. The first pre-cursor is an organic compound to which a transition metal is coupled, by way of example tetrakis (ethyl methyl amido) zirconium can be used to deposit a zirconium compound. As it is generally known from atomic layer deposition techniques, the first pre-cursor 3 covers the surface of the substrate in form of a single atomic or molecular layer. A second pre-cursor 4, for instance water vapour, oxidizes the first pre-cursor 3. The zirconium is decoupled from the organic compound due to the reaction with the water vapour and further oxidized by the water vapour 4. Thus, a single layer of zirconium oxide is formed on the substrate 1. This process can be repeated several times, each time depositing a further single layer of zirconium oxide. This process is stopped when the thickness d1 of the dielectric layer made of zirconium oxide achieves a thickness of 1-8 nanometres, preferably a thickness of 1-4 nanometres.

The conditions in the reaction chamber are preferably set such that the zirconium oxide is deposited in an amorphous or nanocrystalline state. The temperatures in the reaction chamber can be in the range of 150° C.-500° C.

The temperature chosen depends on the first pre-cursor 3 used. For instance, a temperature range of 150° C.-350° C. is used for first pre-cursors based on alkyl amid compounds. These alkyl amid compounds have the constitutional formula M $R^1 R^2 R^3 R^4$; M designates zirconium or other transition metals; $R^1, R^2, R^3$, and $R^4$ are independently selected of alkyl amine functional groups. Alkyl amine functional groups are of the constitutional formula (—$NR^5R^6$); $R^5, R^6$ are independently selected of alkyl functional groups ($C_nH_{2n+1}$). As an other example, a temperature range of 400° C. to 500° C. may be preferred for first pre-cursors based on cyclopentadienyl functional groups. Such first pre-cursors are of the constitutional formula M $(R^1Cp)_2 (R^2R^3)$, wherein M is zirconium or an other transition metal, Cp is cyclopentadienyl, $R^1$ is independently selected of hydrogen and alkyl, preferably methyl or ethyl, and $R^2, R^3$ are independently selected of hydrogen, alkyl—preferably methyl and ethyl—and alkoxy (—O—$C_nH_{2n+1}$).

A pulse of the first pre-cursor 3 injected into a reaction chamber for single wafer processing is of a duration of about 1-60 s and into a reaction chamber for batch processing, i.e. for parallel processing of a plurality of wafer, of about 30-180 s, for instance. It is understood that the duration of the pulses depends on the wafer to be processed and the reaction chambers used.

A typical partial pressure of the first pre-cursor can be in the range of 10-400 Pa (about 0.1-3 torr). The necessary flow rate of the first pre-cursor depends on the reaction chamber employed, a typical value may be in the range of 50 sccm. An additional purge gas, preferably an inert gas like argon or nitrogen, is introduced into the reaction chamber along with the first pre-cursor 3. The purge gas ensures a transport of the first pre-cursor 3 to the wafer and a removal of the first pre-cursor, so that the first pre-cursor reacts with the wafer only during a well defined time slot. The oxidant may be applied without a purge gas.

Water vapour is a weak reactant. Its reactivity is comparably low, but sufficient to decompose the first pre-cursor 3. The reactivity of water vapour is, however, not sufficient to react with the substrate 1, in particular with titanium nitride. The formation of titanium oxide on the titanium nitride due to the presence of water vapour 4 can be neglected.

After a preferred thickness d1 of 1-8 nanometres, most preferably 1-4 nanometres, of the first dielectric layer 2 is achieved, the use of water vapour 4 as weak reactant is stopped. As illustrated in FIG. 2, a new and stronger reactant, namely ozone 5 is used. The reactivity of ozone is higher compared to water vapour 4. It can be demonstrated that by the use of ozone a higher purity of the deposited zirconium oxide layer 6 is obtained. The purity can be further enhanced by increasing the temperature in the reaction chamber. Ozone decomposes the organic compounds of the first pre-cursor 3 to more volatile gases and removes carbon impurities in the dielectric layer by oxidizing them to carbon monoxide or carbon dioxide.

A reaction of ozone 5 with the substrate 1 is inhibited by the first dielectric layer 2.

Instead of the use of water vapour 4 other reaction gases can be used as weak reactants, namely ammonia and hydrazine. The latter compounds are oxygen free and thus cannot transform the surface of an electrode or metallic substrate into a metal oxide. An atomic layer deposition process implements ammonia and hydrazine that react with the pre-cursor transporting a transition metal to a transition metal nitride which is deposited on the surface of the substrate. The deposition of the nitride is proceeded until a sufficient thickness of the nitride layer, e.g. 1-3 nm, is achieved. Then a strong reactant is used which comprises an oxygen compound, namely ozone or bimolecular oxygen. The beneficial effect for a clean dielectric is taught above. Additionally, the strong reactant transforms the transition metal nitride into a transition metal oxide that is desired as final product.

Deposition conditions in the reaction chamber are set such that a second dielectric layer 6 is deposited as an amorphous or a nanocrystalline material. Dielectric layers of zirconium oxide shows improved dielectric properties (e.g. smaller leakage current) when deposited in an amorphous state. They are more suitable for capacitors demanding for a high capacitance and low leakage currents. The amorphous zirconium oxide and other transition metal oxides have a crystallization temperature. Above the crystallization temperature the zirconium oxide recrystallizes at least partly to large grains, leading to uneven interfaces, or even into a monocrystalline state of an unwanted crystal type. It is, therefore, beneficial for processing to use materials having a high crystallization temperature.

A contribution of silicon and/or aluminium as a dopant for the transition metal oxide, for instance the zirconium oxide, increases the crystallization temperature. The concentration of silicon and/or aluminium atoms zirconium atoms in the first dielectric layer 2 and/or in the second dielectric layer 6 can be up in the range of 1 to 10 atomic percent. Other dopants increasing the oxidation temperature are rare earth metal oxides, titanium, hafnium, tantalum, barium, scandium, yttrium, lanthanum, bismuth.

Figure 3:
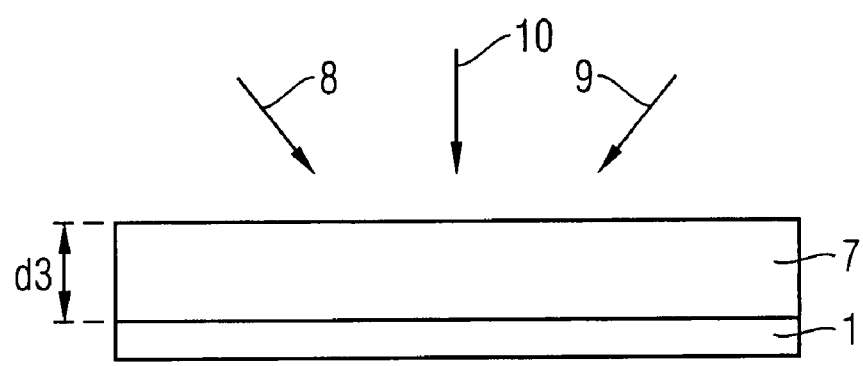
FIGS. 3-5 show schematic cross sections of a deposition method according to a second embodiment of the present invention.
Figure 4:
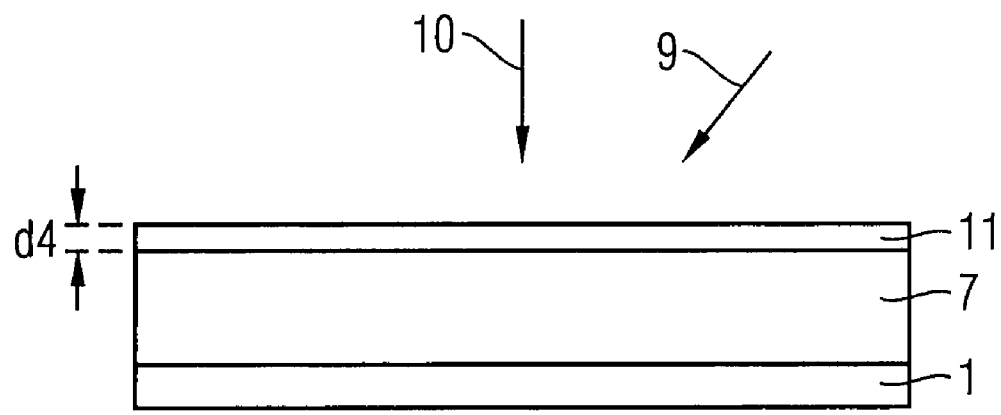
Figure 5:
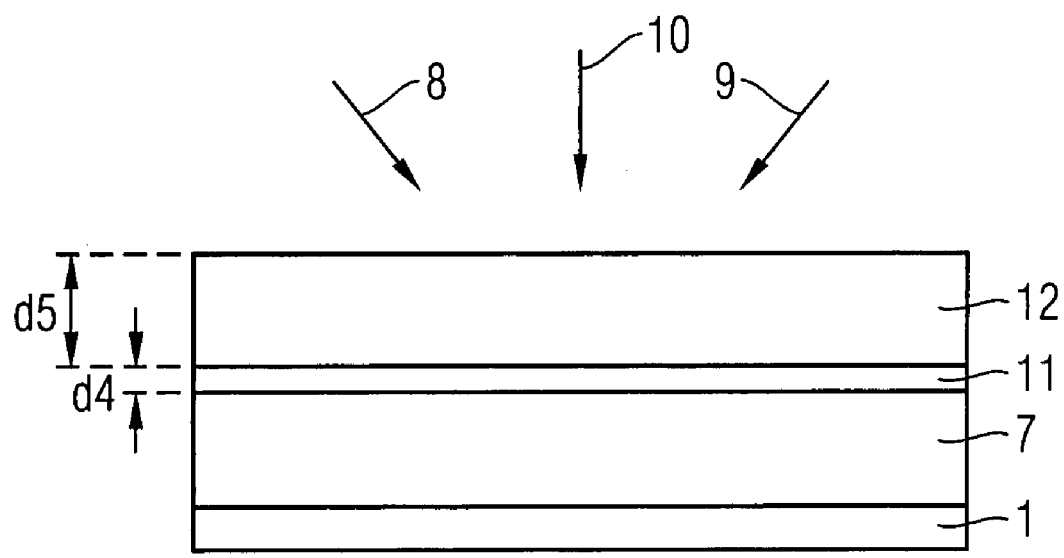

A second embodiment of the transition metal containing material deposition method is illustrated along with FIGS. 3-5. Starting with a substrate 1, identical to the substrate disclosed along with the first embodiment, a first dielectric layer 7 is deposited. The substrate 1 is preferably made of a titanium nitride based film or one of the group of carbon, tantalum nitride, tungsten, ruthenium and/or platinum. The pre-cursor 8 containing a transition metal compound and a reactant 9 are alternatingly applied to the surface of the substrate 1. The reactant 9 is preferably ozone. Like in the first embodiment illustrated along with FIGS. 1 and 2, initially water vapour can be used to deposit the first atomic layers and afterwards the reactant is switched to ozone in order to avoid a formation of a passivated substrate 1.

A dopant is deposited into the first dielectric layer 7. The dopant 10 can be inserted into the reaction chamber along with the first pre-cursor 8 only and the injection be interrupted, when the reactant 9 is introduced, or the dopant (10) is introduced permanently. The dopant may be transported attached to an organic compound. Preferably the reactant 9 reduces the organic compound and sets the dopant free.

The processing conditions are set such that the dielectric layer 7 is deposited in an amorphous or in a nanocrystalline state. The deposition is stopped after a threshold thickness d3 of about 3-6 nanometres is reached. The deposition continues only with the dopant 10. A very thin layer 11 formed only by the dopant material is deposited on the dielectric layer 7. The thickness d4 of this layer is about 1-2 nanometres thick. Along with the dopant, the reactant 9 can be introduced into the reaction chamber for reducing the organic compounds transporting the dopant.

Afterwards, the deposition of a second dielectric layer 12 continues preferably in the same fashion as the first dielectric layer 7 has been deposited, i.e. by use of the first pre-cursor 8 and the reactant 9, in presence of the dopant 10. A thickness d5 of the second dielectric layer 12 is in the same range as the thickness d3 of the first dielectric layer 7.

The steps illustrated in the FIGS. 4 and 5 can be repeated until an overall thickness of all structures is achieved, which matches a desired thickness of a dielectric capacitor.

As it has been explained herein above, it is of major interest to keep the dielectric layers 7 and 11 in an amorphous or at least in a nanocrystalline state. Layer 11 only made of the dopant material stabilizes the amorphous state of the dielectric layers against high temperature annealing steps.

The dopant materials can be chosen from the dopant materials explained along with the first embodiment.

Figure 6:
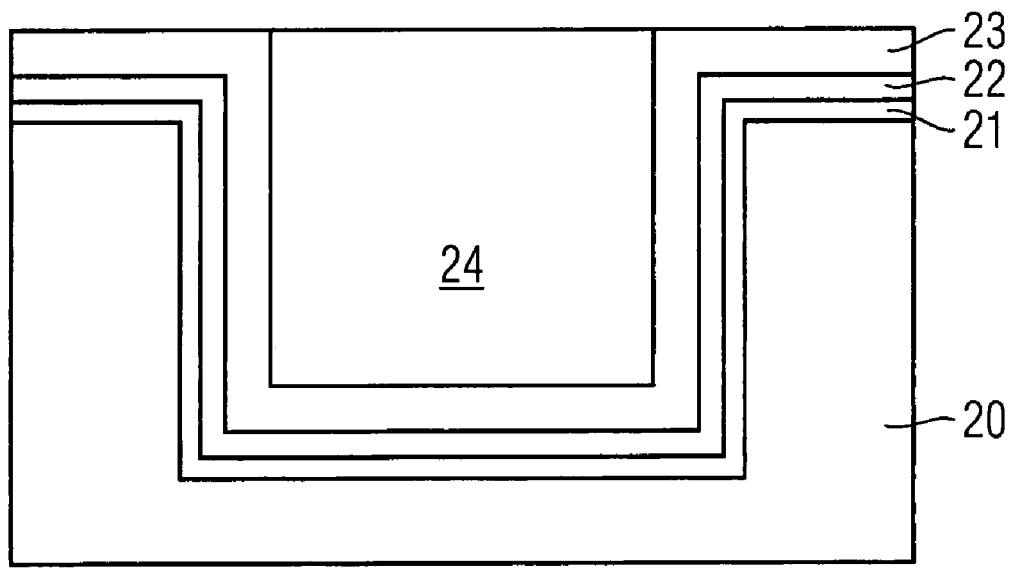
FIG. 6 shows a schematic cross section of a capacitor formed by use of the inventive method.

FIG. 6 shows a cross section of capacitor structure formed by use of one of the above embodiments. The capacitor comprises a first electrode 21, a double layered dielectric 22, 23, and a second electrode 24. The first electrode 21 preferably consists of at least one of titan or titan nitride. The dielectric 22, 23 comprises zirconium oxide or hafnium oxide. The interface of the first electrode 21 and the first layer 22 of the dielectric is free of titan oxide (TiO) and titan oxynitride (TiON). The thickness of the first layer 22 is in a preferred embodiment about 1 nm to 3 nm.

A trench is formed into a substrate 20. The first electrode 21 is deposited on the surface of the trench by a standard deposition technique. The first layer 22 of the dielectric is applied directly on the first electrode 21 by one of the ALD processes that do not oxidise the first layer 22 taught along with the above embodiments. The second layer 23 of the dielectric layer is deposited via use of the oxidising ALD in order to enhance the purity of the already deposited first layer 22 and to form a pure second layer 23. The second electrode 24 may be formed as polycrystalline or a metallic electrode.

Although the present invention has been described with reference to a preferred embodiment, it is not limited thereto, but can be modified in various manners which are obvious for persons skilled in the art. Thus, it is intended that the present invention is only limited by the scope of the claims attached herewith.

Hafnium oxide based dielectrics may be deposited by the two step deposition technique taught along with the two embodiments with zirconium replaced by hafnium. The first pre-cursor is to be replaced by a suitable hafnium containing compound.

What is claimed is:

1. A deposition method for a transition metal containing dielectric comprising:
    providing a substrate with at least one conductive portion at the surface;
    successively applying a first pre-cursor comprising a transition metal compound and a second pre-cursor predominantly comprising at least one of water vapour, ammonia and hydrazine on the at least one conductive portion for forming a first layer of a transition metal containing material; and
    successively applying the first pre-cursor and a third pre-cursor comprising at least one of ozone and oxygen on the first layer for forming a second layer of the transition metal containing material, the second layer directly contacting the first layer,
    wherein the transition metal is chosen from at least one of the group of hafnium and zirconium for forming a dielectric comprising at least one of the group of hafnium oxide and zirconium oxide, and
    wherein the first layer is formed comprising a transition metal content of at least 50 atomic percent of the transition metal containing material excluding oxygen.

2. A deposition method for a transition metal containing dielectric comprising:
    providing a substrate with at least one conductive portion at the surface;
    successively applying a first pre-cursor comprising a transition metal compound and a second pre-cursor predominantly comprising at least one of water vapour, ammonia and hydrazine on the at least one conductive portion for forming a first layer of a transition metal containing material; and
    successively applying the first pre-cursor and a third pre-cursor comprising at least one of ozone and oxygen on the first layer for forming a second layer of the transition metal containing material, the second layer directly contacting the first layer,
    wherein at least a portion of a top layer of the at least one conductive portion is formed of at least one material of the group of titanium compounds, titanium nitride, carbon, tantalum nitride, tantalum carbide, tungsten, ruthenium, ruthenium oxide, iridium, iridium oxide and platinum.

3. A deposition method for a transition metal containing dielectric comprising:
    providing a substrate with at least one conductive portion at the surface;
    successively applying a first pre-cursor comprising a transition metal compound and a second pre-cursor predominantly comprising at least one of water vapour, ammonia and hydrazine on the at least one conductive portion for forming a first layer of a transition metal containing material; and
    successively applying the first pre-cursor and a third pre-cursor comprising at least one of ozone and oxygen on the first layer for forming a second layer of the transition metal containing material, the second layer directly contacting the first layer,
    wherein a dopant layer comprising a dopant is applied along with the first pre-cursor, the dopant comprising at least one of the group of silicon, aluminium, rare earth metal, titanium, hafnium, tantalum, barium, scandium, yttrium, lanthanum, niobium, bismuth, calcium and cerium.

4. The deposition method according to claim 3, wherein the dopant layer is formed on the second layer by only applying the dopant.

5. The deposition method according to claim 4, wherein a third layer is deposited on the dopant layer by successively applying the first pre-cursor and water vapour.

6. The deposition method according to claim 5, wherein a fourth layer is deposited on the third layer by successively applying the first pre-cursor and ozone.

7. The deposition method according to claim 6, wherein a further layer is deposited on the dopant layer by successively applying the first pre-cursor and ozone.

8. The deposition method according to claim 1, wherein the first pre-cursor is at least one compound of the group of tetrakis (dialkyl amido) hafnium, tetrakis (diethyl amido) hafnium (TDEAH), tetrakis (dimethyl amido) hafnium (TDMAH), tetrakis (ethyl methyl amido) hafnium (TEMAH), monocyclopentadienyl hafnium, bis-cyclopentadienyl hafnium, tetrakis (dialkyl amido) zirconium, tetrakis (diethyl amido) zirconium, tetrakis (dimethyl amido) zirconium, tetrakis (ethyl methyl amido) zirconium, mono-cyclopentadienyl zirconium, and bis-cyclopentadienyl zirconium.

9. The deposition method according to claim 8, wherein a dopant is applied along with the first pre-cursor, the dopant comprising at least one of the group silicon, aluminium, rare earth metal, titanium, hafnium, tantalum, barium, scandium, yttrium, lanthanum, niobium, bismuth, calcium and cerium.

* * * * *